United States Patent
Olsen et al.

(10) Patent No.: US 7,652,243 B2
(45) Date of Patent: Jan. 26, 2010

(54) AMPLIFICATION WITH FEEDBACK CAPACITANCE FOR PHOTODETECTOR SIGNALS

(75) Inventors: Alf Olsen, Oslo (NO); Eric R. Fossum, La Canada, CA (US); Giuseppe Rossi, Pasadena, CA (US)

(73) Assignee: Aptina Imaging Corporation (KY)

( * ) Notice: Subject to any disclaimer, the term of this patent is extended or adjusted under 35 U.S.C. 154(b) by 0 days.

(21) Appl. No.: 12/334,805

(22) Filed: Dec. 15, 2008

(65) Prior Publication Data

US 2009/0266976 A1    Oct. 29, 2009

Related U.S. Application Data

(62) Division of application No. 11/650,424, filed on Jan. 8, 2007, now Pat. No. 7,473,883, which is a division of application No. 11/521,350, filed on Sep. 15, 2006, now Pat. No. 7,291,822, which is a division of application No. 11/351,036, filed on Feb. 10, 2006, now Pat. No. 7,199,349, which is a division of application No. 10/813,073, filed on Mar. 31, 2004, now Pat. No. 7,183,531.

(51) Int. Cl.
*H03F 3/08* (2006.01)

(52) U.S. Cl. .................... 250/214 A; 250/208.1; 250/214 R; 348/300; 348/301; 348/302

(58) Field of Classification Search ............ 250/214 A, 250/208.1, 214 R; 348/300–302
See application file for complete search history.

(56) References Cited

U.S. PATENT DOCUMENTS

| | | | |
|---|---|---|---|
| 5,892,540 | A | 4/1999 | Kozlowski et al. |
| 5,900,623 | A | 5/1999 | Tsang et al. |
| 5,945,663 | A | 8/1999 | Bird |
| 6,121,843 | A | 9/2000 | Vampola et al. |
| 6,130,423 | A | 10/2000 | Brehmer et al. |
| 6,538,245 | B1 | 3/2003 | Kozlowski |
| 6,552,324 | B1 | 4/2003 | Kothari et al. |
| 6,583,398 | B2 | 6/2003 | Harkin |
| 6,809,767 | B1 | 10/2004 | Kozlowski et al. |
| 6,885,396 | B1 | 4/2005 | Panicacci et al. |
| 6,952,004 | B2 | 10/2005 | Henderson |
| 2005/0134715 | A1 | 6/2005 | Fowler et al. |

*Primary Examiner*—Seung C Sohn
(74) *Attorney, Agent, or Firm*—Dickstein Shapiro LLP

(57) ABSTRACT

Signals from an imager pixel photodetector are received by an amplifier having capacitive feedback, such as a capacitive transimpedance amplifier (CTIA). The amplifier can be operated at a low or no power level during an integration period of a photodetector to reduce power dissipation. The amplifier can be distributed, with an amplifier element within each pixel of an array and with amplifier output circuitry outside the pixel array. The amplifier can be a single ended cascode amplifier, a folded cascode amplifier, a differential input telescopic cascode amplifier, or other configuration. The amplifier can be used in pixel configurations where the amplifier is directly connected to the photodetector, or in configurations which use a transfer transistor to couple signal charges to a floating diffusion node with the amplifier being coupled to the floating diffusion node.

9 Claims, 13 Drawing Sheets

AMPLIFICATION WITH FEEDBACK CAPACITANCE FOR PHOTODETECTOR SIGNALS

This application is a divisional of application Ser. No. 11/650,424, filed Jan. 8, 2007, now U.S. Pat. No. 7,473,883 which is a divisional of application Ser. No. 11/521,350, filed Sep. 15, 2006, now U.S. Pat. No. 7,291,822 which is a divisional of application Ser. No. 11/351,036, filed Feb. 10, 2006, now U.S. Pat. No. 7,199,349 which is a divisional of application Ser. No. 10/813,073, filed on Mar. 31, 2004, now U.S. Pat. No. 7,183,531 which are hereby incorporated by reference in their entireties.

FIELD OF THE INVENTION

The present invention relates generally to imager circuits and, more specifically to circuits and methods for amplification of an output signal for pixel sensors.

BACKGROUND OF THE INVENTION

Various imager circuits have been proposed including charge coupled device (CCD) arrays, complementary metal oxide semiconductor (CMOS) arrays, arrays combining both CCD and CMOS features, as well as hybrid infrared focal-plane arrays (IR-FPAs). Conventional arrays have light-sensing elements, typically referred to as "pixels" and readout circuitry that provides signals indicating light sensed by the pixels.

For example, a CMOS imager includes a focal plane array of pixel cells; each cell includes a photodetector, for example, a photogate, photoconductor or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion node, connected to the gate of the source follower transistor. Charge generated by the photodetector is sent to the floating diffusion node. The imager may also include a transistor for transferring charge from the photodetector to the floating diffusion node and another transistor for resetting the floating diffusion node to a predetermined charge level prior to charge transference.

FIG. 1 illustrates a block diagram of a CMOS imager device 908 having a pixel array 200 with each pixel cell being constructed as described above. Pixel array 200 comprises a plurality of pixels arranged in a predetermined number of columns and rows. The pixels of each row in array 200 are all turned on at the same time by a row selected line, and the pixels of each column are selectively output by respective column select lines. A plurality of rows and column lines are provided for the entire array 200. The row lines are selectively activated in sequence by the row driver 210 in response to row address decoder 220 and the column select lines are selectively activated in sequence for each row activation by the column driver 260 in response to column address decoder 270. Thus, a row and column address is provided for each pixel. The CMOS imager is operated by the control circuit 250, which controls address decoders 220, 270 for selecting the appropriate row and column lines for pixel readout, and row and column driver circuitry 210, 260 which apply driving voltage to the drive transistors of the selected row and column lines. The pixel output signals typically include a pixel reset signal, $V_{rst}$ taken off of the floating diffusion node when it is reset and a pixel image signal, $V_{sig}$, which is taken off the floating diffusion node after charges generated by an image are transferred to it. The $V_{rst}$ and $V_{sig}$ signals are read by a sample and hold circuit 265 and are subtracted by a differential amplifier 267, which produces a signal $V_{rst}$-$V_{sig}$ for each pixel representing the amount of light impinging on the pixel. This difference signal is digitized by an analog to digital converter 275. The digitized pixel signals are then fed to an image processor 280 to form a digital image.

A type of amplifier commonly used in active pixel sensors (APS) is the source follower, an example of which is illustrated in FIG. 1A. Array 100 includes pixels in rows and columns, with four pixels shown. Each pixel includes a photodetector and a source follower transistor. In pixel 102, for example, photodetector 110 illustratively shown as a photodiode, is connected to source follower transistor 115 which is in turn connected to column readout line 116 by a row select signal on line 118. Load transistor 120 responds to bias voltage $V_{In}$, and functions as a current source. As a result, source follower transistor 115 provides a voltage level on line 116 that reflects or follows the voltage level received at its gate from photodetector 110, optionally through a transfer transistor (not shown).

Source follower amplifiers have a number of limitations when used in an APS. For example, typical gains for source follower amplifiers are on the order of 0.8 or lower. In FIG. 1A, source follower 115 senses voltage across photodetector 110, and the conversion gain depends on the capacitance of photodetector 110. If the sensor area of photodetector 110 is increased for high sensitivity, conversion gain decreases accordingly, leaving the output voltage on line 116 substantially unchanged.

Source follower amplifiers also have limited output swing and linearity. For example, the output voltage of source follower transistor 115 is limited because the current source transistor 120 drops out of saturation causing the gain to drop even lower. In addition, the output voltage swing is limited on the downward side when the photodiode loses its reverse bias. Also, the signal collected across the diode capacitance is nonlinear because the capacitance of the PN-junction varies with the voltage across it. The dynamic range of an APS imager with source follower amplifiers is usually limited by the source follower.

For these and other reasons, other amplifiers have been proposed for APS imagers. For example, capacitive transimpedance amplifiers (CTIAs) have been used for reading out hybrid infrared focal-plane arrays (IR-FPAs). The basic CTIA circuits for a single ended amplifier and a differential input are illustrated in FIGS. 2 and 3 respectively.

In a single ended CTIA configuration, illustrated in FIG. 2, an input signal $V_{pd}$ produced by photodetector 150 is provided to the input of CTIA 152. Capacitor 156 provides a feedback path for amplifier 152. Reset switch 154 resets photodetector 150 when closed, and select switch 160 provides an output path to column bus 158 when closed.

In a differential configuration illustrated in FIG. 3, an input signal $V_{pd}$ produced by photodetector 162 is provided to the "−" input of amplifier 168. A reference voltage REF is provided to the "+" input of amplifier 168. Capacitor 166 provides a feedback path for amplifier 168. Reset switch 164 resets photodetector 162 when closed, and select switch 170 provides an output path to column bus 172 when closed. A CTIA with a differential input is advantageous as opposed to a single ended input because it provides increased noise immunity and can directly control a detector bias voltage maintaining $V_{pd}$ at the REF level.

Hybrid IR-FPAs include two chips. A detector chip is made of an infrared-sensitive material such as HgCdTe, InGaAs or InSb. A readout chip connected to the detector chip is typically a CMOS circuit containing an array of pixel readout circuits. These readout circuits, however, are designed for infrared detectors, which are characterized by sizeable background signals, considerable dark current, and relatively low resistance.

CTIAs are used with IR-FPAs because they provide a stable bias for a detector during an integration period, as well as a known integration capacitance and reduced noise. However, fixed pattern noise (FPN) is a critical issue in some applications, and an array with a CTIA in each pixel is highly susceptible to FPN due to offsets in the amplifier and output stages.

A critical issue for most image sensors is power consumption. For example, in a 1.3 megapixel sensor with an upper limit of 65 milliwatts for pixel power dissipation, the average power per cell must be below 50 nanowatts. At a bias of 3.3 volts, for example, this implies a maximum average current of 15 nanoamps. At such a low current, a CTIA would have a slow slew rate under reset conditions, making it inappropriate for applications requiring higher readout rates.

It would be advantageous to have improved amplification techniques for image sensors.

SUMMARY OF THE INVENTION

The present invention provides methods and apparatus in which photodetector signals are amplified with feedback capacitance. In exemplary embodiments, a difference signal is obtained from reset and signal outputs from a CTIA. A CTIA is operated at a low power or no power level during a photodetector's integration period, and a CTIA is operated open loop during integration. In distributed embodiments, each pixel includes an amplifier element and other amplifier circuitry which is located outside the array of pixels.

The foregoing and other features and advantages of the invention will become more apparent from the detailed description of the exemplary embodiments of the invention given below in connection with the accompanying drawings.

DETAILED DESCRIPTION OF THE INVENTION

The present invention provides techniques that may be used in commercial applications of image sensors. Exemplary applications include monolithic visible image sensors and a variety of hybrid infrared focal plane arrays and stacked structure visible sensors.

As used herein, the term "capacitive transimpedance amplifier" or "CTIA" includes any amplifying circuitry in which there is a capacitive feedback path unless otherwise specified. In a simple example, a capacitive element could be connected between the signal input and signal output leads of amplifying circuitry, but various other configurations can be implemented, such as with a primary capacitive element and an additional capacitor element that can be connected in parallel to increase capacitance.

The pixels discussed herein are illustrated and described as inventive modifications to three transistor (3T) pixel circuits for the sake of example only. It should be understood that the invention may be used with other pixel arrangements having more (e.g., 4T) than three transistors.

Figure 1:
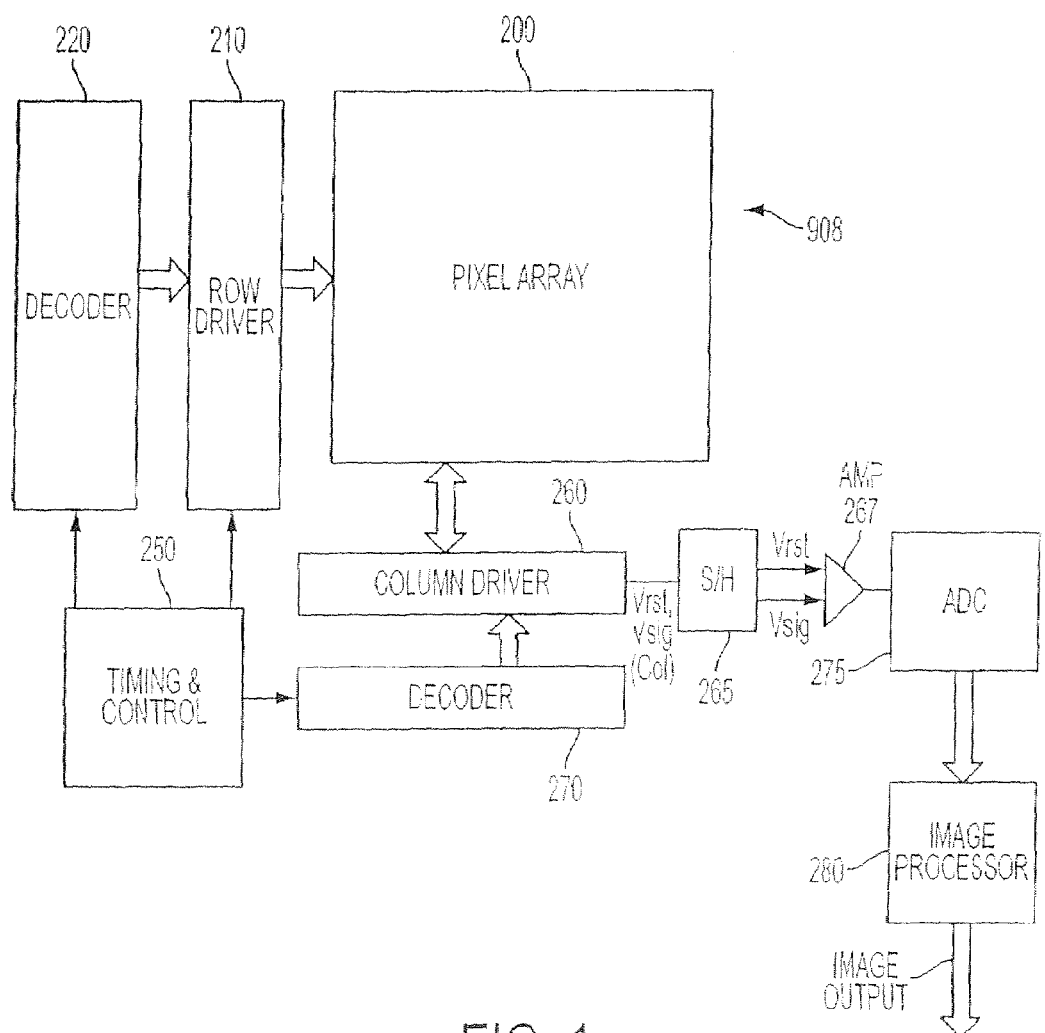
FIG. 1 is a block diagram of a conventional CMOS imager.
Figure 1A:
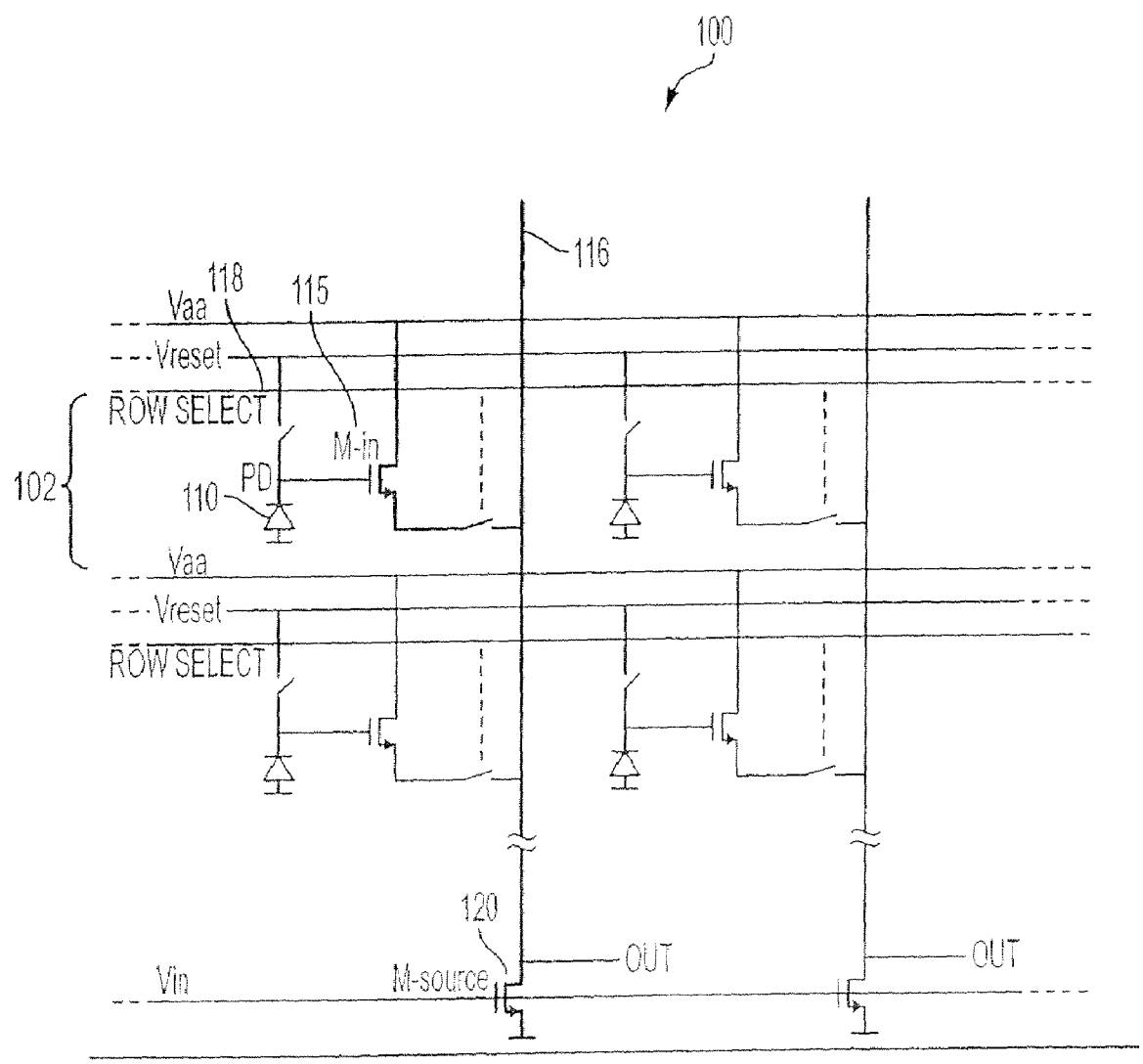
FIG. 1A is a schematic diagram of conventional imager readout circuitry with source follower amplifiers.
Figure 2:
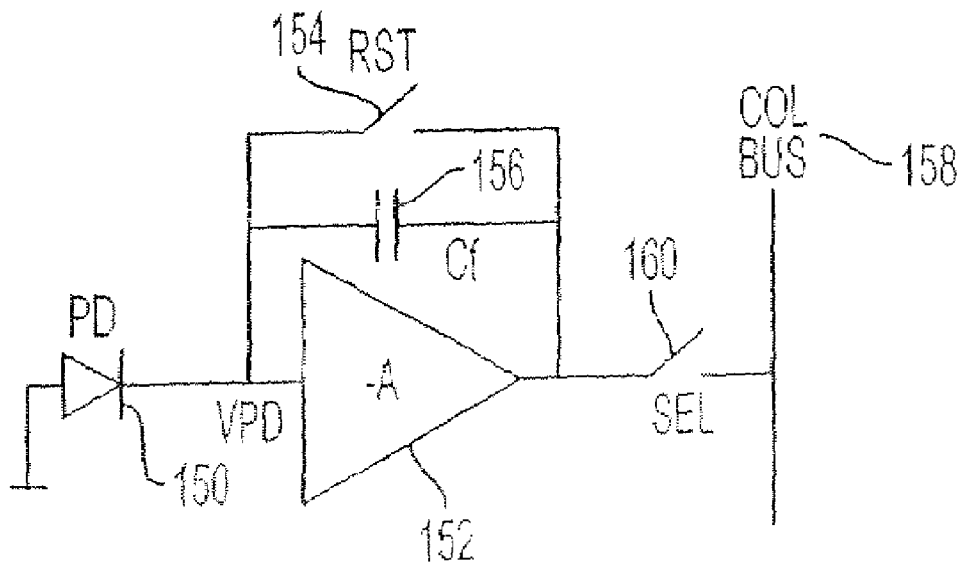
FIG. 2 is a schematic diagram of a conventional circuit with a single ended capacitive transimpedance amplifier (CTIA)
Figure 3:
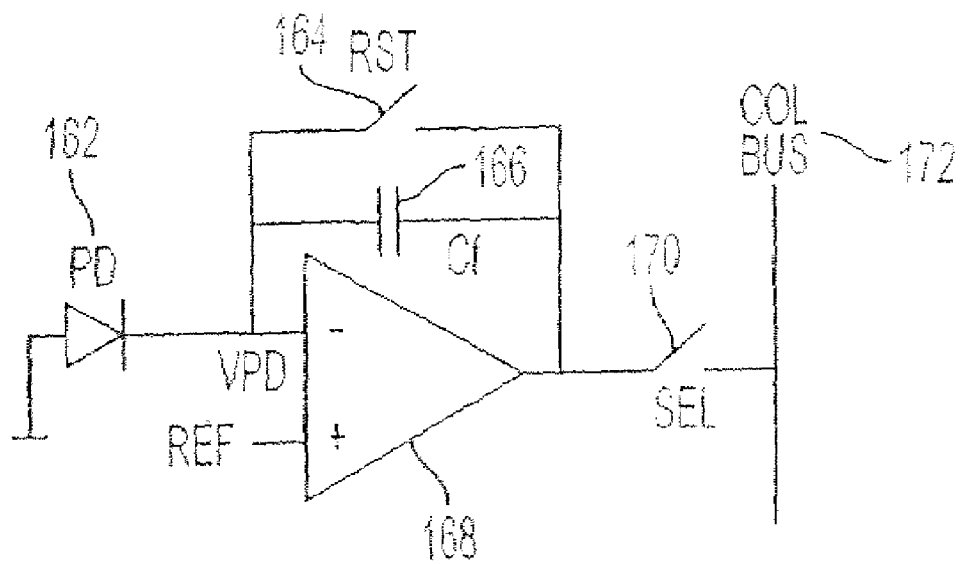
FIG. 3 is a schematic diagram of a conventional circuit with a differential CTIA.
Figure 4:
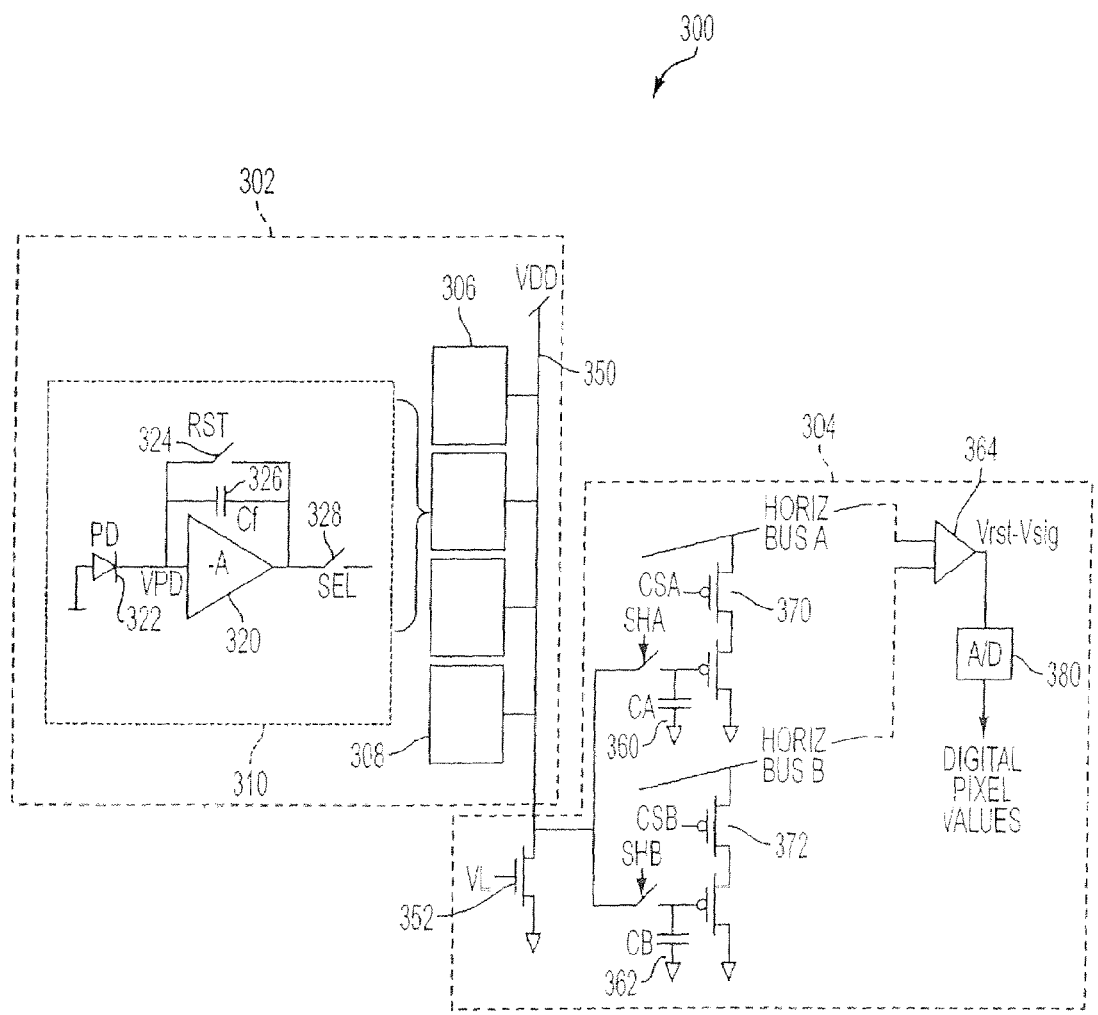
FIG. 4 is a schematic circuit diagram of imager circuitry using a single ended CTIA with dual sampling according to a first embodiment.
Figure 4A:
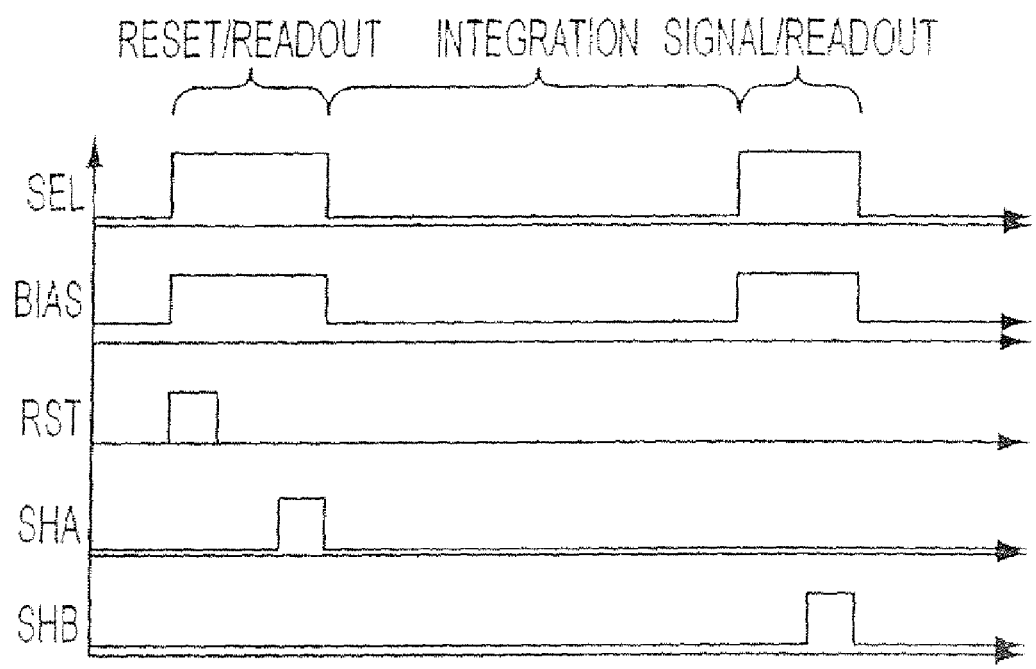
FIG. 4A is a timing diagram for control signals in the circuitry of FIG. 4.

FIG. 4 illustrates a first embodiment in which imager circuitry 300 includes pixel array 302 and peripheral circuitry 304. Array 302 includes rows and columns of pixel cells, with pixel cells 306 through 308 of one column shown in FIG. 4. Pixel 310 is shown in more detail. FIG. 4A illustrates several control signals that can be provided by a control circuit similar to control circuit 250 in FIG. 1.

Pixel 310 illustratively includes a single ended CTIA 320 which receives an input signal $V_{pd}$ due to accumulated charge from photodetector 322. Capacitor 326 provides a feedback path for amplifier 320. Reset switch 324 resets photodetector 322 to $V_{dd}$, and select switch 328 provides a connection to column bus 350 for reset or readout operations. Peripheral circuitry 304 includes, for each column bus 350, a load transistor 352 and sample and hold (S/H) circuits. The output from column bus 350 is taken at the high side of load transistor 352 which is illustratively an n-channel device controlled by a signal $V_L$.

As shown, peripheral circuitry 304 includes a dual sampling stage for reducing thermal kTC charge fluctuation reset noise from feedback capacitor 326 or other voltage offsets in pixel 310. The pixel 310 output is read twice per sampling frame, once to obtain reset signal, $V_{rst}$, immediately after photodetector 322 is reset, and once to obtain a pixel image signal, $V_{sig}$ after an integration period in which charge generated by photodetector 322 accumulates. As shown in FIG. 4A, $V_{rst}$ and $V_{sig}$ are read by pulsing signals SHA and SHB, respectively, storing $V_{rst}$ in capacitor 360 and $V_{sig}$ in capacitor 362. Signal SHA is pulsed during a reset/sampling period, and signal SHB is pulsed during a signal sampling period. $V_{rst}$ and $V_{sig}$ are then subtracted by differential amplifier 364 when p-channel transistors 370 and 372 are turned on by CSA and CSB signals. Amplifier 364 produces a differential signal $V_{rst}$-$V_{sig}$ for a pixel representing the amount of light impinging on the pixel.

A differential signal reduces FPN due to voltage offsets in pixel 310. Also, the addition of dual sampling means that large offsets can be tolerated. Rather than two S/H circuits, a clamp circuit for each column could perform dual sampling. The differential signal can also be converted to a digital pixel value by an analog to digital converter 380, allowing digital image processing. To further reduce FPN, additional delta double sampling (DDS) circuitry may be included.

In order to improve amplifier power dissipation, amplifier 320 operates at multiple power levels, for example, ultra low power during integration and high power during readout of pixel 310. In FIG. 4A, the BIAS signal illustratively drops from a higher level during readout to an ultra low level during the integration period and at other times. Multiple power levels could be implemented in many ways, for example, a single applied bias voltage level can be increased from its low level during integration to a high level during readout to boost a bias current level. A bias switching circuit (not shown) could switch amplifier 320 between a low bias circuit and a high bias circuit. If a current bias is stored in a current copier cell included in pixel 310, the current copier cell can be written to just prior to readout to boost the current level to amplifier 320 during readout; after readout, the current copier cell can be written to in order to restore amplifier 320 to a low power level.

The use of multiple power levels in operating amplifier 320 permits rapid and timely reset of pixel 310 while maintaining low power dissipation during integration which occurs over a longer duty cycle than readout. By only increasing power for a selected row during readout and maintaining a low power level during integration, the average power dissipation of array circuitry 302 is not affected. The higher readout power level can be a level at which the output speed of pixel 310 can be utilized in commercial imager applications, which require a high readout rate.

For example, an imager array having R rows in which a selected row's power is boosted for N row readout times from a level Pl to Ph, the average power dissipated by a pixel increases from Pl to Pavg where:

Pavg=[1+(Ph/Pl−1)N/R]Pl

Consequently, if Ph/Pl=100, N=3 and R=1024, the average power is increased by 29%. In other words, the power Ph utilized for readout can be 100 times the integration power, Pl, with only a 29% increase in total power dissipation.

In another example, the integration power Pl can be set to zero. This will halt the operation of amplifier 320 and feedback will malfunction allowing bias voltage in photodetector 322 to droop. Since charge is being accumulated by photodetector 322 during integration and there is no signal readout, the operation of amplifier 320 is not required. However, the bias voltage on photodetector 322 must be of sufficient magnitude before power droops to zero to maintain the operation of the photodetector 322 in a reverse bias condition during the integration period despite droop.

Although the multiple power techniques are described above in conjunction with a dual sampling technique, the two techniques could be used independently. In addition, either or both techniques could be used in combination with other techniques such as open loop techniques described below.

Figure 5:
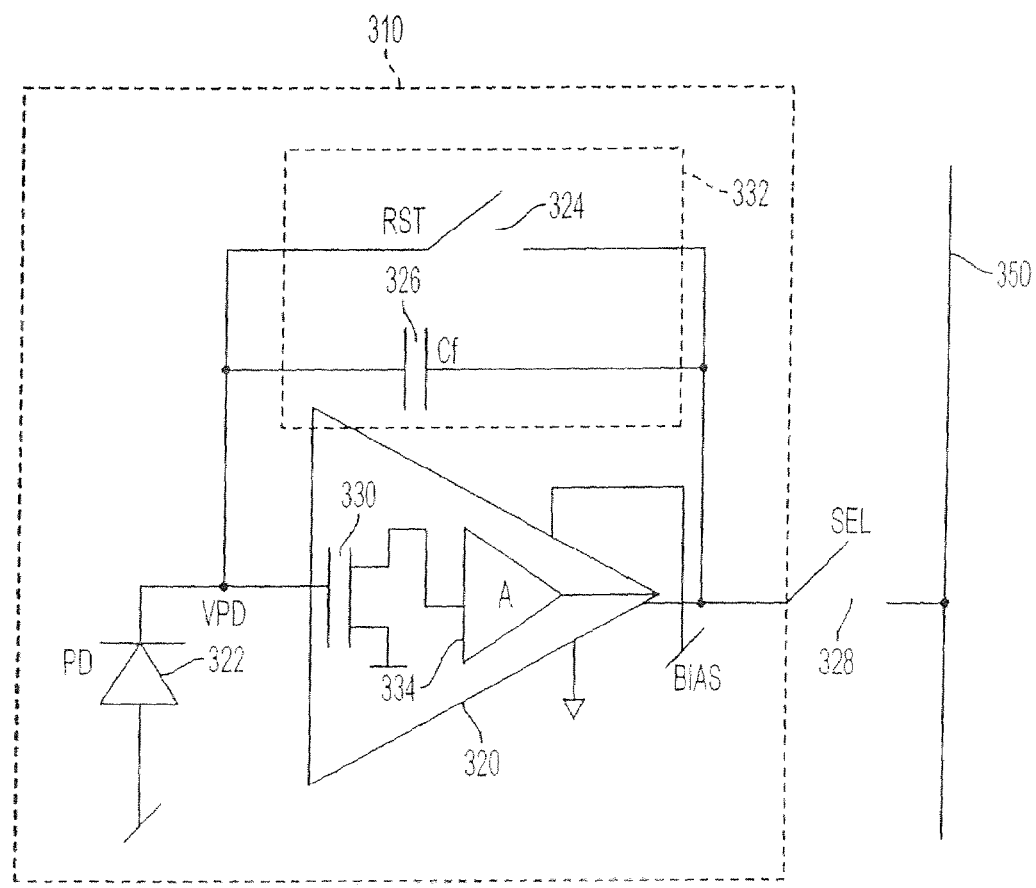
FIG. 5 is a detailed view of a three transistor pixel cell of FIG. 4.
Figure 6:
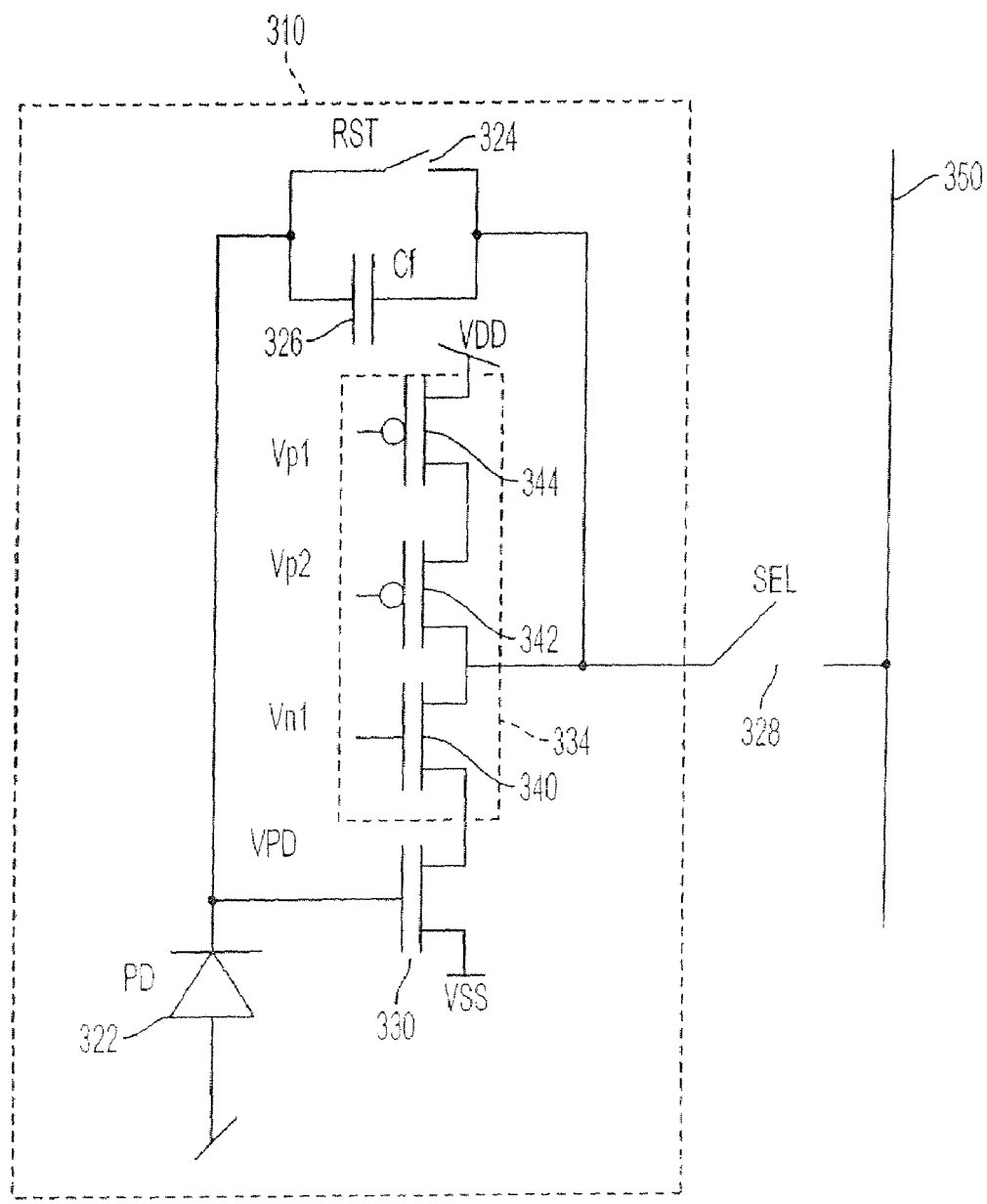
FIG. 6 is a schematic circuit diagram of a pixel cell using a four transistor single ended cascode amplifier according to a second embodiment.

FIGS. 5 and 6 illustrate pixel cell 310 in greater detail. As illustrated in FIG. 5, pixel 310 can be analyzed into components as follows: (1) CTIA input transistor 330, (2) feedback branch 332, which includes reset switch 324 and capacitor 326, (3) CTIA output stage 334 and (4) pixel photodetector 322. Input transistor 330 and reset switch 324 are typically NMOS devices while component (3) is typically a combination of NMOS and PMOS devices. Each component's configuration may be altered depending on the circuit complexity and performance. For example, if circuit simplicity is a requirement, component (3) can be made of only NMOS devices, trading off performance, such as open loop gain. If high performance is a requirement, component (3) can be made of CMOS devices, i.e., a combination of NMOS and PMOS devices.

Figure 5A:
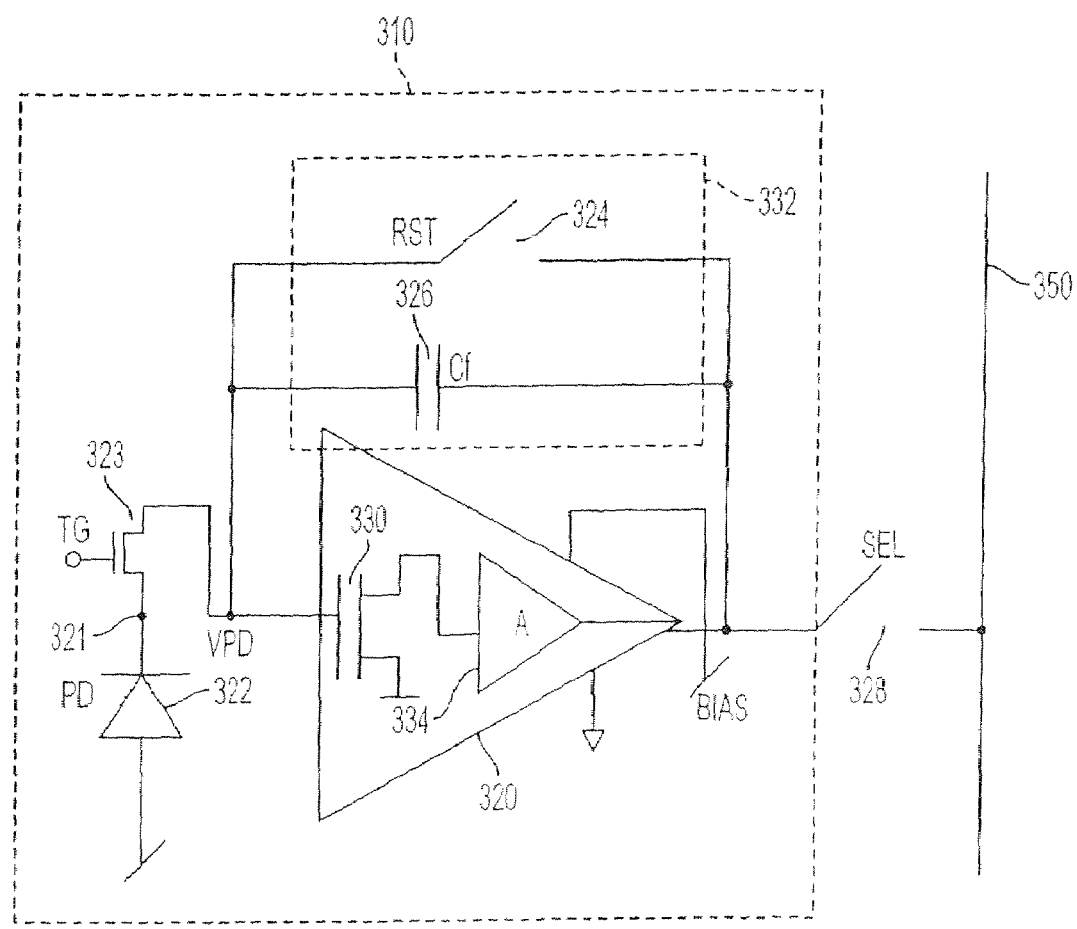
FIG. 5A is a detailed view of a four transistor pixel cell of FIG. 4.

As illustrated in FIG. 5A, pixel cell 310 may have other pixel arrangements. FIG. 5A depicts a pixel cell which includes an additional transfer transistor 323 for transferring charge between photodetector 322 and a floating diffusion node coupled to the input of the CTIA 320. The transfer transistor 323 transfers charge accumulated at storage node 321 to the floating diffusion node and CTIA input transistor 330 for amplification and charge readout.

A configuration as illustrated in FIG. 6 yields a high open loop gain and good noise performance because input transistor 330 and transistors 340, 342, and 344 together form a single ended 4-transistor cascode amplifier. A configuration as illustrated in FIG. 6 yields a high open loop gain and better noise performance than the configuration illustrated in FIG. 5 because transistors 330 and 340 have n-channels while transistors 342 and 344 have p-channels. On the other hand, complementary devices in a pixel's area are undesirable due to process constraints and problems optimizing such a circuit.

FIGS. 7-10 illustrate embodiments in which the output stage is distributed differently than in FIGS. 4-6, avoiding complementary devices in a pixel cell. In general, these embodiments can operate open-loop during the integration period. While in open-loop operation, a pixel's photodetector is floating and discharges according to the input of photoelectrons and the detector's intrinsic capacitance supplemented by an explicit capacitor if necessary. Open-loop operation during the integration period allows for the placement of certain elements of a CTIA outside the pixel cell. The CTIA advantage of maintaining a constant bias current is lost, but the advantages of signal independent conversion gain and improved reset biasing are retained.

Figure 7:
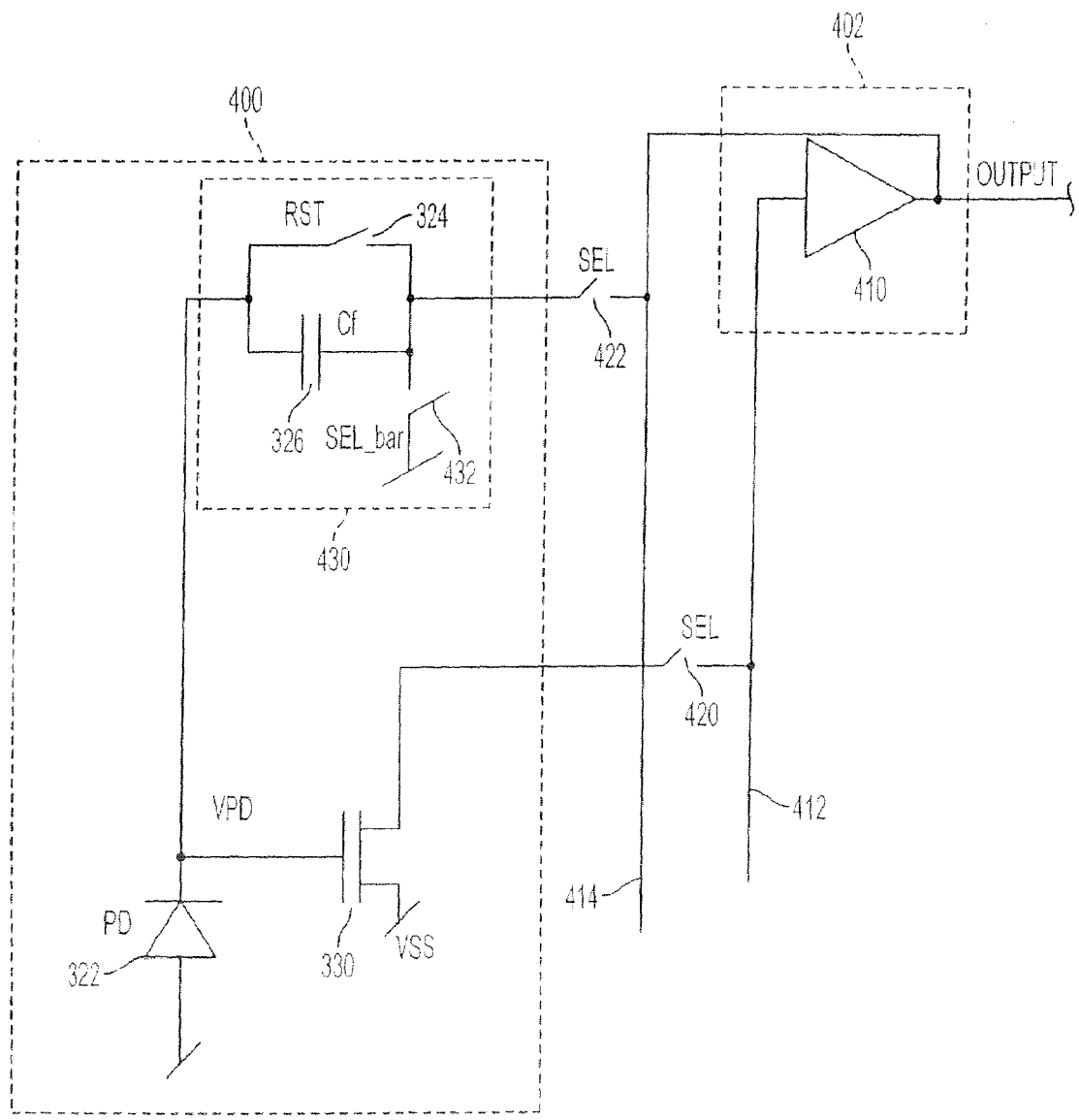
FIG. 7 is a schematic circuit diagram of a pixel cell using a distributed amplifier according to a third embodiment.
Figure 8:
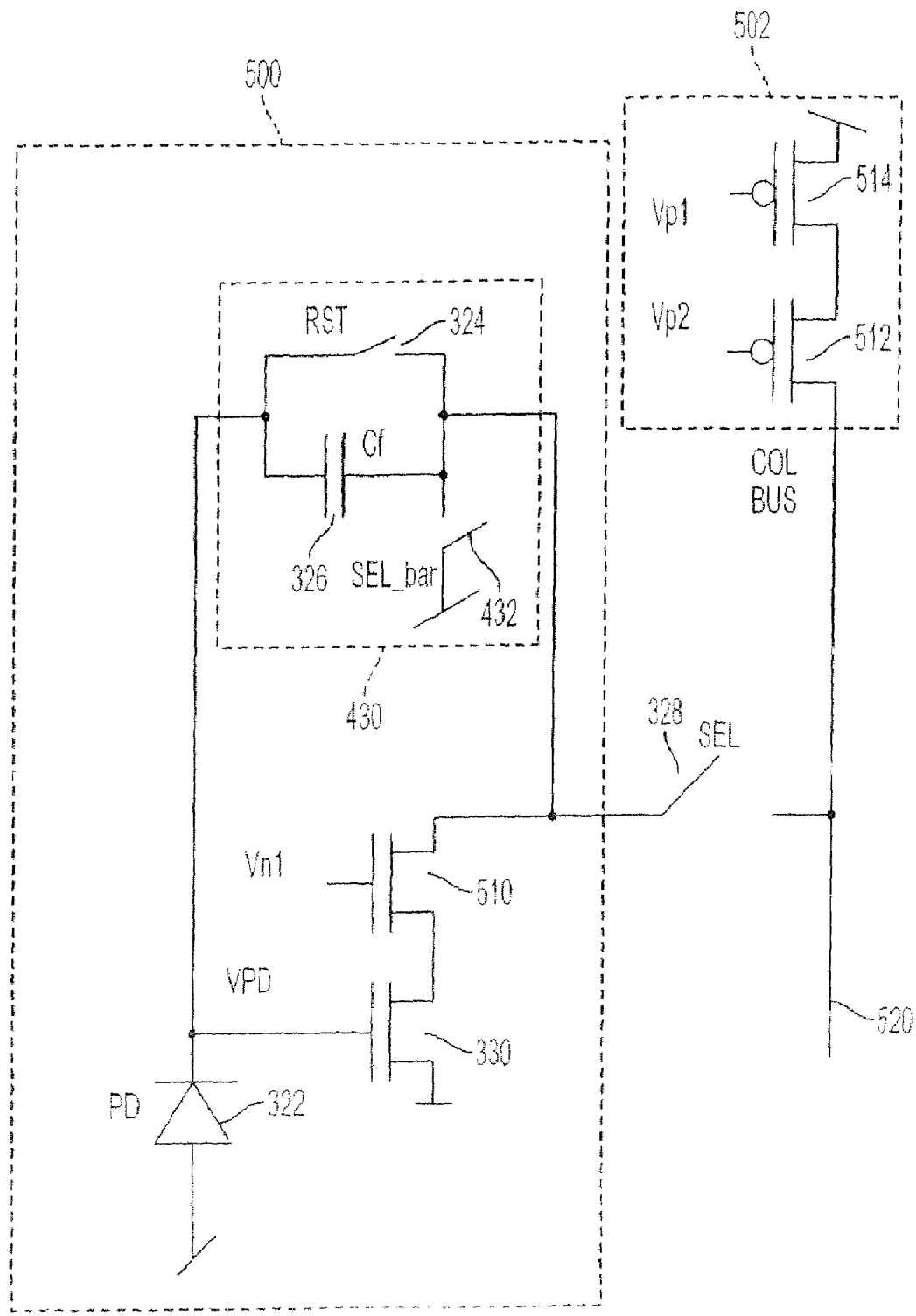
FIG. 8 is a schematic circuit diagram of a distributed four transistor single ended cascode amplifier according to a fourth embodiment.
Figure 9:
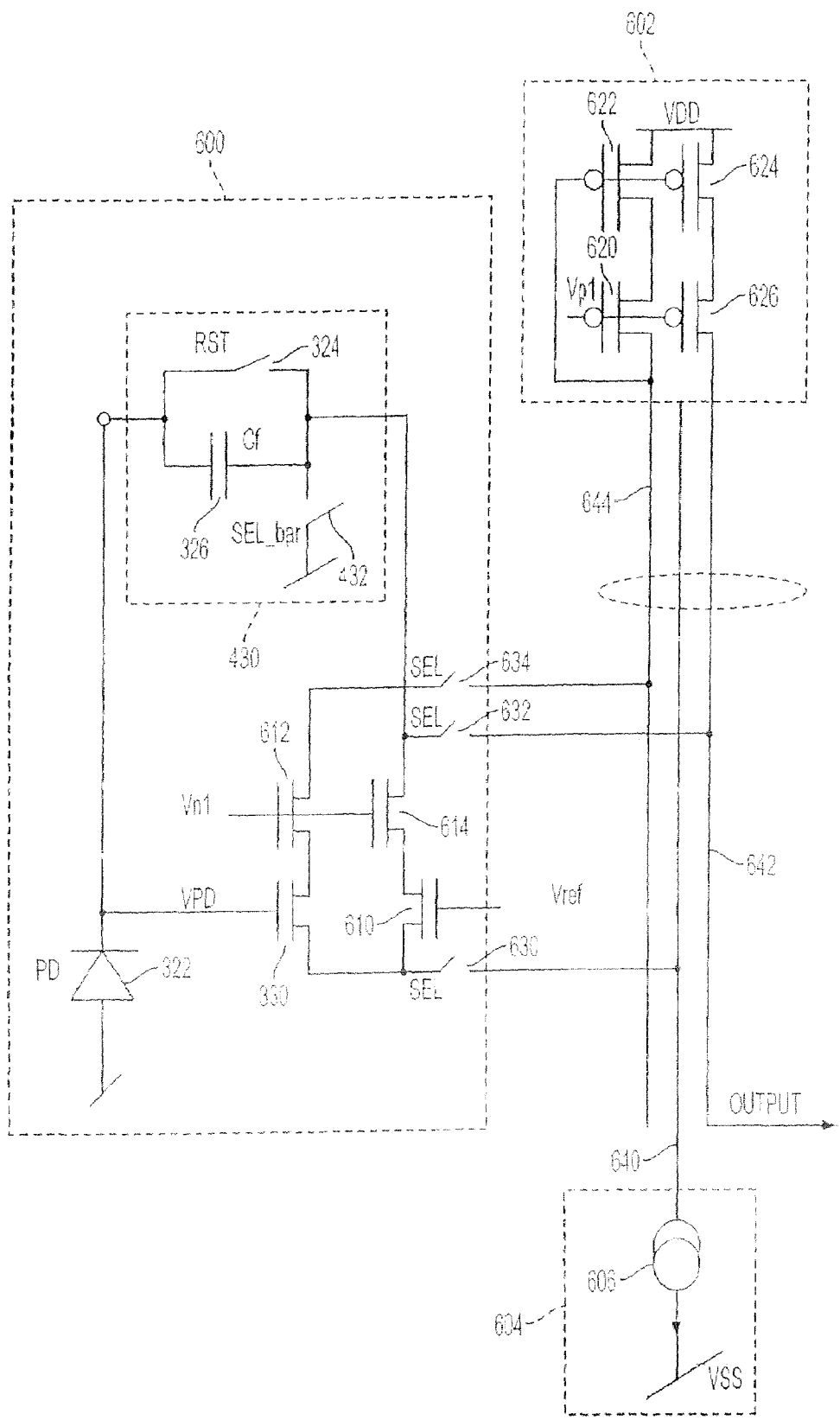
FIG. 9 is a schematic circuit diagram of a distributed single stage differential input telescopic cascode amplifier according to a fifth embodiment.

In FIGS. 7-9, components with the same reference numerals as in FIGS. 4-6 can be understood from the descriptions of FIGS. 4-6 above.

FIG. 7 illustrates a pixel cell 400 with a distributed CTIA architecture. FIG. 7 also shows a portion of peripheral circuitry 402 outside the active pixel array that includes pixel 400. At the array's periphery, more substrate area and device processing capability is available than in the array. Output stage 410 is in peripheral circuitry 402, connected to pixel 400 by column lines 412 and 414, which also provide connections to all pixel cells in the same column as pixel 400. Output stage 410 is only connected to pixel cell 400 when row select signals SEL close switches 420 and 422, also closing the feedback loop through capacitor 326 which occurs during signal readout. Since only one row of cells is connected at a time during readout, multiple pixel cells in the same column can share the same output stage 410, while each pixel has its own input transistor 330, feedback branch 430, and photodetector 322. In addition, the area in pixel cell 400 formerly devoted to output stage 410 (i.e., output stage 334 in FIG. 5) could be used to increase the size of photodetector 322. Switch 432, which is closed by SEL_bar the complement of the SEL signal, connects capacitor 326 to ground during the integration period. This isolates a floating diffusion node between photodetector 322 and input transistor 330, allowing photodetector 322 to droop to ground. Therefore, $V_{pd}$ must be biased during reset to a sufficiently high voltage to keep photodetector 322 reverse biased during the integration period.

FIG. 8 similarly illustrates a pixel cell 500 and peripheral circuitry 502, another example of a distributed architecture. As in FIG. 6, input transistor 330 and output stage transistors 510, 512 and 514 form a single ended 4-transistor cascode amplifier, but with transistors 512 and 514 in peripheral circuitry 502. Using a cascode amplifier provides isolation from line capacitance of column bus 520 as well as providing a high open loop gain, frequency response enhancement and stability.

During integration, feedback capacitor 326 is connected to ground using switch 432, as described above in relation to FIG. 7. Since charge is being accumulated by photodetector 322 during each integration period and there is no signal readout until the period ends, the operation of output stage transistors 510, 512 and 514 and input transistor 330 is not required until readout.

In the distributed architecture of FIG. 8, only part of the output stage resides outside of pixel cell 500. Output stage transistors 512 and 514 are only connected to pixel cell 500 during signal readout while row select signal SEL closes switch 328. Since only one row of cells is connected at a time during readout, multiple pixel cells in the same column can share the same output stage transistors 512 and 514. In addition, the area in pixel cell 500 formerly devoted to output stage transistors 512 and 514 (i.e., transistors 342, 344 in FIG. 6) can be used to increase the size of photodetector 322. Transistor 510 is between input transistor 330 and output stage transistors 512 and 514 in the cascode, and Vn1, Vp1 and Vp2 provide bias voltages for the cascode amplifier.

FIG. 8 also shows how feedback branch 430 can always be connected to the output of the distributed cascode amplifier, whenever row select signal SEL closes switch 328.

FIG. 9 illustrates a pixel cell 600, and a more complex example of a distributed architecture. Peripheral circuitry includes output stage portion 602 and current source portion 604 with current sink 606. Input transistors 330 and 610, and output stage transistors 612, 614, 620, 622, 624, and 626 form a fully differential 4-transistor telescopic cascode amplifier with $V_{ref}$ received at transistor 610. The cascode amplifier's p-type load circuitry in portion 602 and its current sink 606 are located outside pixel cell 600, illustratively at the imager array periphery. Switches 630, 632 and 634 are all closed by row select signal SEL to connect to column bus lines 640, 642 and 644, respectively, during readout. Consequently, pixel cell 600 possesses advantages like those of pixel cell 500 and also has a differential voltage swing connection at its output.

Any of the pixel cell embodiments described in FIGS. 4-9 may utilize the dual sampling techniques in FIG. 4 and 4A. An integrated circuit can include an array of pixel cells of any of FIGS. 4-9 with suitable peripheral circuitry. The circuits described above could also readily be modified to include correlated double sampling (CDS) suppression circuitry such as a clamped capacitor in each pixel to reduce kTC reset noise.

Figure 10:
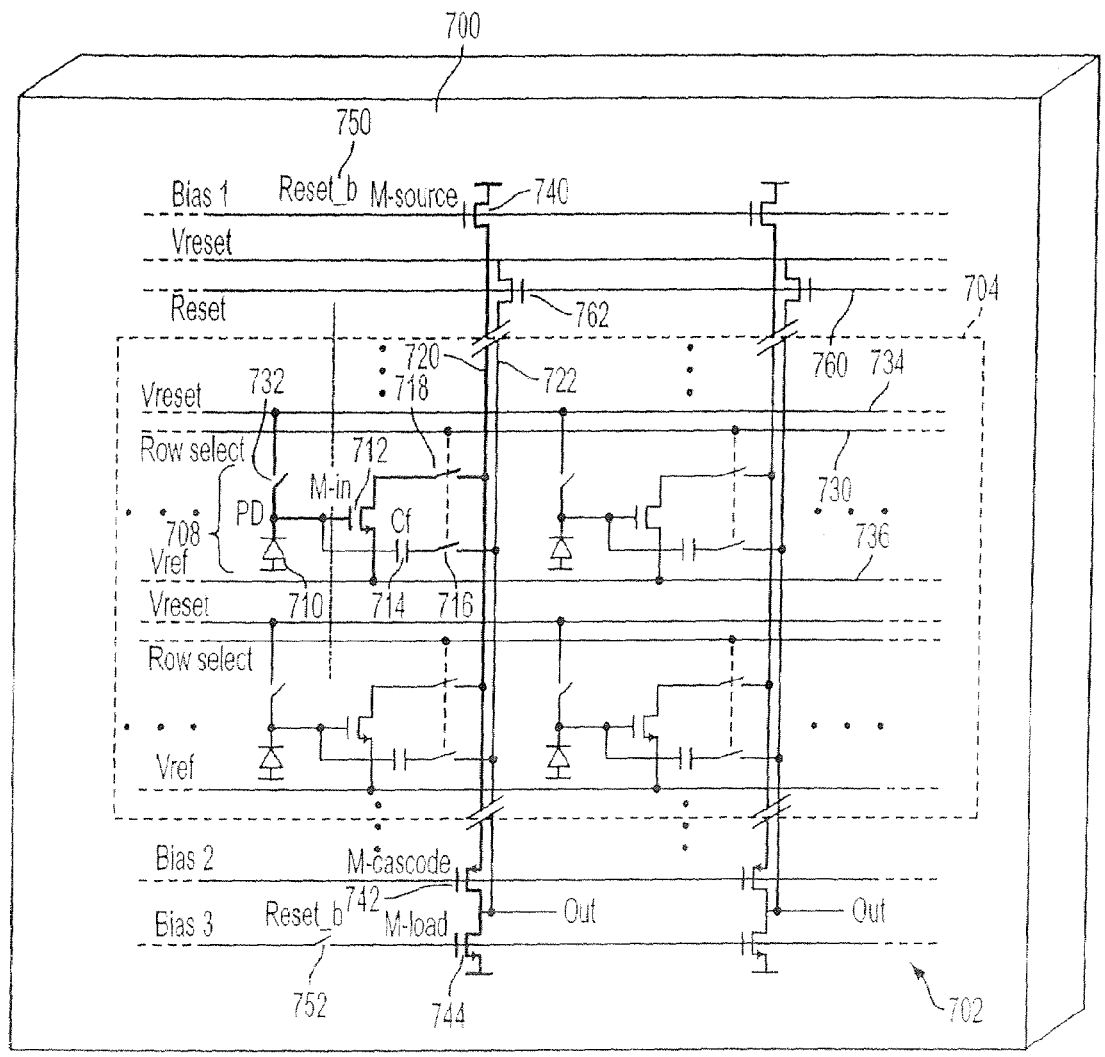
FIG. 10 is a schematic circuit diagram of an imager with a distributed four transistor single ended folded cascode amplifier according to a sixth embodiment.

FIG. 10 shows substrate 700 at a surface of which imager circuitry 702 has been formed to provide an imager integrated circuit (IC). Circuitry 702 includes an array 704 of pixel cells in rows and columns of which four pixel cells are shown. Circuitry 702 also includes components at the periphery of array 704, some of which are shown.

Features of array 704 can be understood from the structure of representative pixel cell 708. Photodetector 710, illustratively shown as a photodiode, is connected to CTIA input transistor (M-in) 712 as well as feedback capacitor (CF) 714, a linear capacitor. Switches 716 and 718 close to connect respectively to column lines 720 and 722 in response to a pulse on Row select line 730. Switch 732 closes to reset photodetector 722 to the reset voltage $V_{reset}$ in response to a pulse on reset line 760. $V_{ref}$ line 736 provides reference voltage $V_{ref}$ to transistor 712.

When switches 716 and 718 are closed, transistor 712 in pixel 708 and output stage transistors 740, 742 and 744 form a folded single ended four-transistor cascode amplifier with one current branch, distributed between pixel 708 and peripheral circuitry for the column that includes pixel 708. The amplifier output from between cascode transistor (M-cascode) 742 and load transistor (M-load) 744, is fed back to capacitor 714 through column line 722 and switch 716. Current source transistor (M-source) 740, M-cascode 742, and M-load 744 are all connected with their channels in series between power and ground voltages, and M-source 740 and M-load 744 receive bias voltages through switches 750 and 752, respectively, both of which are closed by Reset_b, the complement of the signal on Reset line 760. Reset line 760 turns on transistor 762 and switch 732 to pull column line 722 and the floating diffusion node, input of CTIA, to $V_{reset}$ during reset while switches 750 and 752 open to turn off transistors 740 and 744. During readout, the cascode amplifier operates due to closing of switches 716 and 718 by a Row select signal on line 730. In the cascode, transistor 712 has low voltage gain, but high voltage swing appears at the high impedance output.

Because of high gain, photocharge generated by photodetector 710 is completely collected in capacitor 714 when the Row select signal closes switches 716 and 718, and the capacitance Cf of capacitor 714 determines the conversion gain. Therefore, area of photodetector 710 can be increased without reducing conversion gain. Linearity and voltage swing can be improved compared with a source follower as in FIG. 1, avoiding limitations in dynamic range.

Although illustratively implemented with NMOS transistors 712 and 744 and PMOS transistors 740 and 742, the cascode amplifier could be implemented by complementary components. In other words, each NMOS device could be changed to PMOS and vice versa, power and ground could be reversed, and $V_{ref}$ could be adjusted. This would provide less flicker noise (1/f noise).

Figure 11:
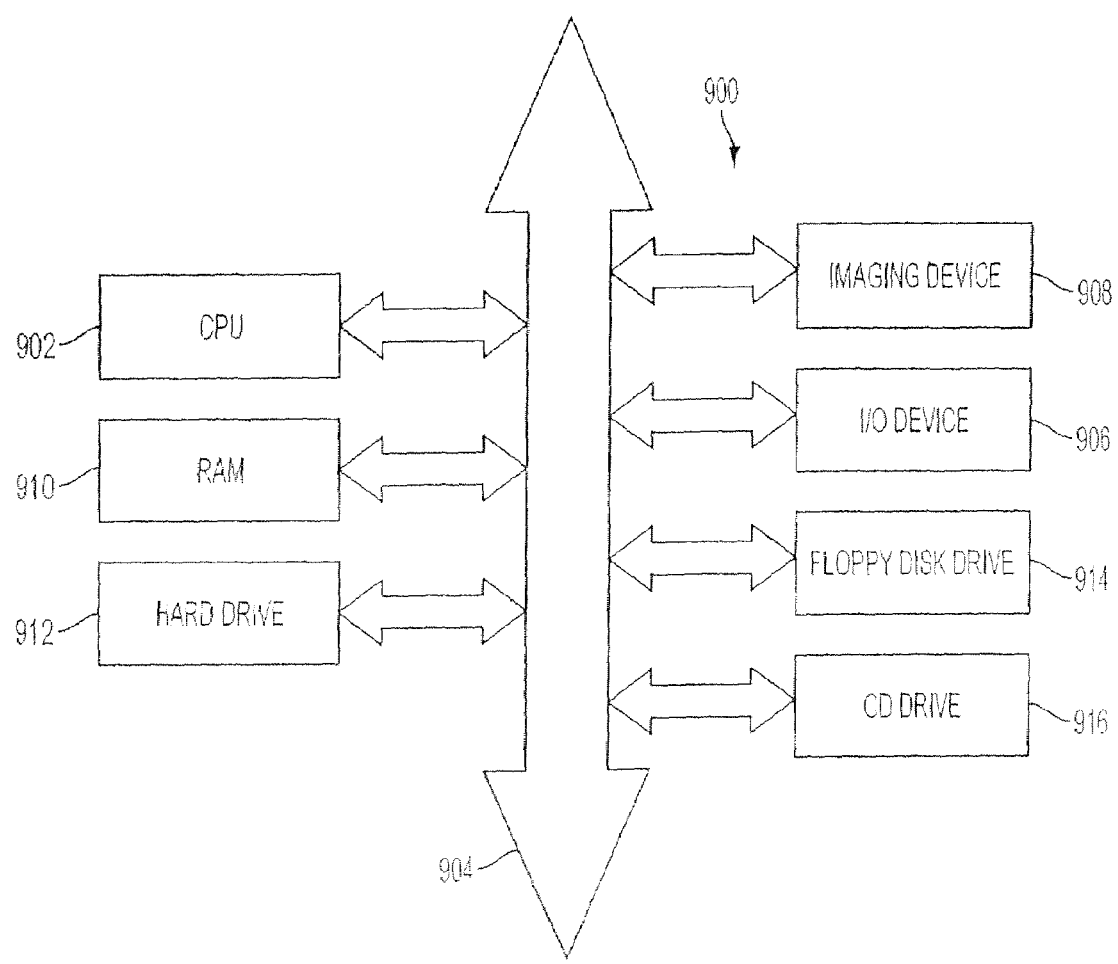
FIG. 11 is a schematic diagram of a processing system which employs an imager having an array of pixels in accordance with any of the exemplary embodiments in FIGS. 4-10.

FIG. 11 shows a processor system 900, which includes an imager device 908 (FIG. 1) as modified to include pixel array circuitry in accordance with any of the exemplary embodiments of the invention. The imager device 908 may receive control signals or other data from system 900. System 900 includes a processor 902 having a central processing unit (CPU) that communicates with various devices over a bus 904. Some of the devices connected to the bus 904 provide communication into and out of the system 900; an input/output (I/O) device 906 and imager device 908 are such communication devices. Other devices connected to the bus 904 provide memory, illustratively including a random access memory (RAM) 910, hard drive 912, and one or more peripheral memory devices such as a floppy disk drive 914 and compact disk (CD) drive 916. The imager device 908 may, in turn, be coupled to processor 902 for image processing, or other image handling operations. Examples of processor based systems, which may employ the imager device 908, include, without limitation, computer systems, camera systems, scanners, machine vision systems, vehicle navigation systems, video telephones, surveillance systems, auto focus systems, star tracker systems, motion detection systems, image stabilization systems, and others.

The devices described above illustrate typical devices of many that could be used. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A method of operating a pixel cell, the method comprising:
   generating photogenerated charges with a photodetector during an integration period;
   operating a capacitive transimpedance amplifier at a first power level during said integration period;
   amplifying said charges generated by said photodetector with said capacitive transimpedance amplifier operating at a second power level during a readout period; and
   resetting, before the integration period, the capacitive transimpedance amplifier and a storage node used for storing the charges generated by the photodetector using a voltage received over a column bus.

2. The method of claim 1, wherein said first power level equals zero watts.

3. The method of claim 1 further comprising biasing the photodetector to a sufficient voltage before the integration period to maintain the photodetector in a reverse bias condition during said integration period.

4. The method of claim 1 further comprising operating said capacitive transimpedance amplifier in an open loop during said integration period.

5. A method of operating a pixel cell, the method comprising:
   generating photogenerated charges with a photodetector during an integration period;
   halting operation of a capacitive transimpedance amplifier during said integration period;
   activating the operation of the capacitive transimpedance amplifier to amplify the charges generated by the photodetector during a readout period; and
   resetting, before the integration period, the capacitive transimpedance amplifier and a storage node used for storing the charges generated by the photodetector using a voltage received over a column bus.

6. The method of claim 5, wherein the act of halting operation of the capacitive transimpedance amplifier comprises applying a power level equal to zero watts to the amplifier.

7. The method of claim 5, wherein the act of activating the operation of the capacitive transimpedance amplifier comprises applying a power level greater than zero watts to the amplifier.

8. The method of claim 5 further comprising the step of biasing the photodetector to a sufficient voltage before the integration period to maintain the photodetector in a reverse bias condition during the integration period.

9. A method of operating a pixel cell, the method comprising:
   resetting, before an integration period and using a voltage received over a column bus, a capacitive transimpedance amplifier and a charge storage node;
   reverse biasing a photodetector before the integration period;
   generating photogenerated charges with the photodetector during the integration period;
   operating the capacitive transimpedance amplifier at a first power level during the integration period; and
   amplifying the charges generated by the photodetector with the capacitive transimpedance amplifier operating at a second power level greater than the first power level during a readout period.

* * * * *